United States Patent [19]

Stickney et al.

[11] Patent Number: 5,320,736
[45] Date of Patent: Jun. 14, 1994

[54] METHOD TO ELECTROCHEMICALLY DEPOSIT COMPOUND SEMICONDUCTORS

[75] Inventors: John L. Stickney; Brian W. Gregory; Ignacio Villegas, all of Athens, Ga.

[73] Assignee: University of Georgia Research Foundation, Athens, Ga.

[21] Appl. No.: 695,969

[22] Filed: May 6, 1991

Related U.S. Application Data

[63] Continuation-in-part of Ser. No. 640,597, Jan. 11, 1991, abandoned.

[51] Int. Cl.$^5$ ................................................ C25D 5/10
[52] U.S. Cl. ..................................... 205/157; 205/170; 205/171; 205/177; 205/182; 205/915
[58] Field of Search ............... 205/170, 171, 123, 148, 205/157, 915, 177, 182; 204/86, 92; 156/611

[56] References Cited

U.S. PATENT DOCUMENTS

| | | | |
|---|---|---|---|
| 4,058,430 | 11/1977 | Suntola et al. | 156/611 |
| 4,260,427 | 4/1981 | Fulop et al. | 136/255 |
| 4,261,802 | 4/1981 | Fulop et al. | 204/29 |
| 4,345,107 | 8/1982 | Fulop et al. | 136/255 |
| 4,400,244 | 8/1983 | Kroger et al. | 204/2.1 |
| 4,425,194 | 1/1984 | Kroger et al. | 204/2.1 |
| 4,465,565 | 8/1984 | Zanio | 204/56 R |
| 4,581,108 | 4/1986 | Kapur et al. | 204/37.1 |
| 4,816,120 | 3/1989 | Ondris et al. | 204/37.1 |
| 4,834,831 | 5/1989 | Nishizawa et al. | 156/611 |
| 4,861,417 | 8/1989 | Mochizuki et al. | 156/610 |

FOREIGN PATENT DOCUMENTS 2-74587  3/1990  Japan .................................. 156/611

Primary Examiner—John Niebling
Assistant Examiner—William T. Leader
Attorney, Agent, or Firm—Deveau, Colton & Marquis

[57] ABSTRACT

A method to electrochemically deposit semiconductors and for the electrochemical formation of epitaxial thin-film, single-crystalline compound semiconductors comprising alternating electrodeposition of atomic layers of selected pairs of elements using underpotential deposition.

20 Claims, 10 Drawing Sheets

Au ⭘⭘⭘⭘⭘⭘⭘⭘⭘⭘⭘⭘

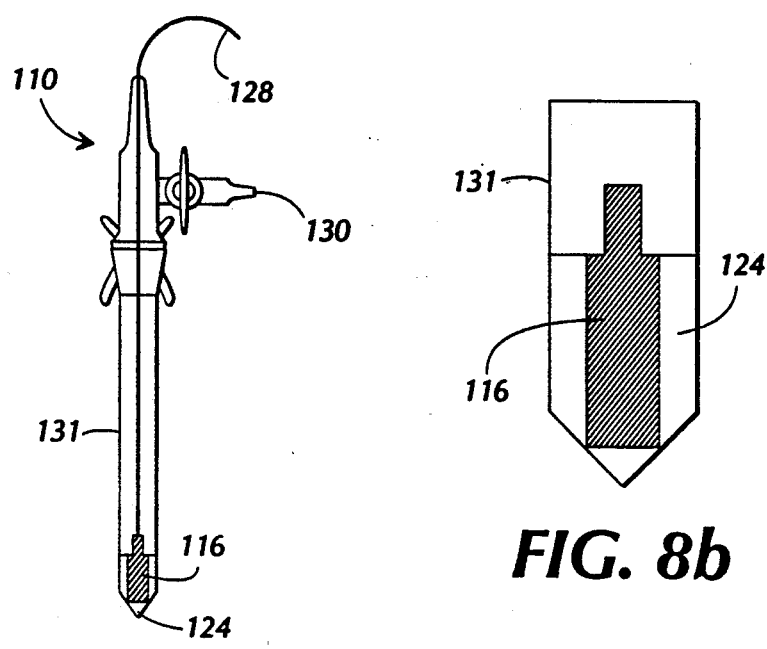
FIG. 8a
FIG. 8b
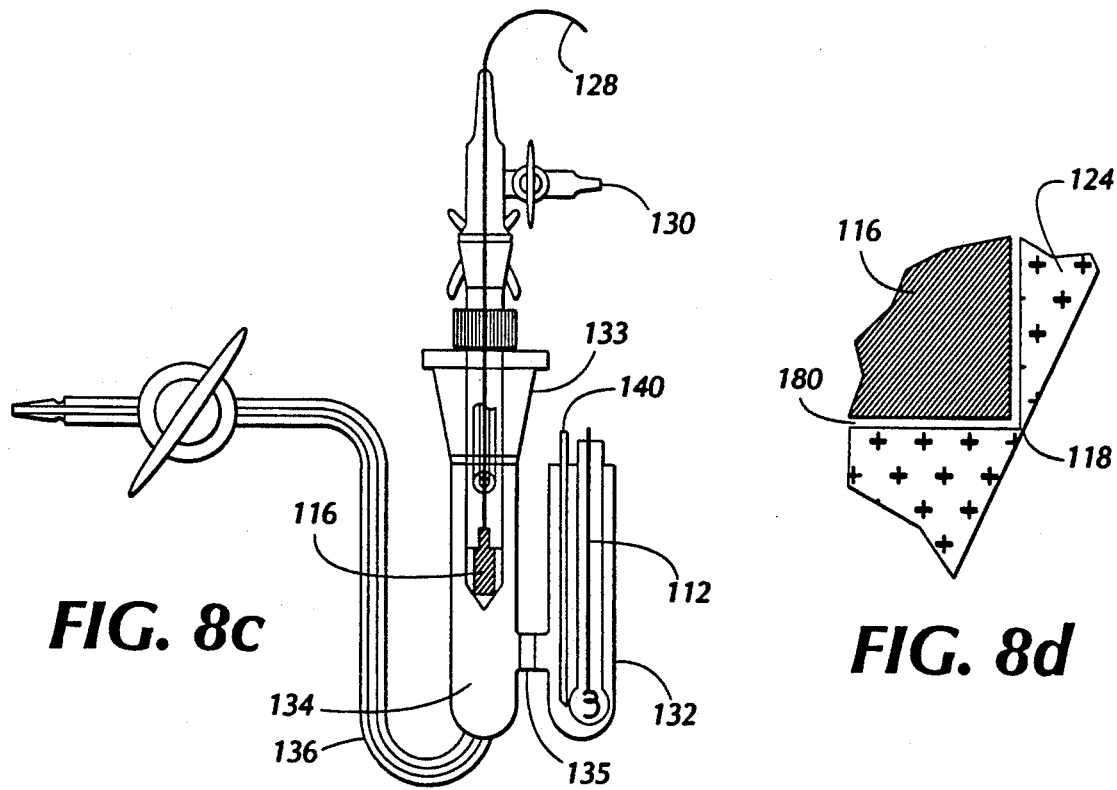
FIG. 8c
FIG. 8d

METHOD TO ELECTROCHEMICALLY DEPOSIT COMPOUND SEMICONDUCTORS

This is a continuation-in-part of copending application Ser. No. 07/640,597 filed on Jan. 11, 1991, now abandoned.

BACKGROUND OF THE INVENTION

1. Field of the Invention

This invention is directed generally toward methods to electrochemically deposit semiconductors and for the electrochemical formation of epitaxial, thin-film, single-crystalline compound semiconductors. More specifically, this invention is directed toward a method for the electrochemical deposition of semiconductors by alternately depositing atomic layers of the component elements.

2. Prior Art

Presently, drawbacks to standard electrodeposition methods include the tendency to form amorphous or polycrystalline deposits, sometimes described as "cauliflower" deposits because of their convoluted morphology. The extensive grain boundary networks in polycrystalline materials increase their resistivity and provide recombination centers, and are thus detrimental to most applications. Improving the crystallinity of electrodeposited compound semiconductors is the next step in the evolution of electrodeposition as an important production technique for these compounds.

One example of the state of the art in the use of electrodeposition of elements to produce a compound semiconductor is disclosed in U.S. Pat. No. 4,581,108 issued to Kapur et al. Kapur teaches the alternated electrodeposition of elements, and the subsequent heating of these elements to form an essentially homogeneous layer of semiconductive compound. As is readily apparent, Kapur deposits relatively thick layers of the first element, typically 500 to 1000 atomic layers, before changing over and depositing 500 to 1000 atomic layers of the second element. Additionally, the actual formation of the semiconductive material in Kapur is achieved through the subsequent annealing of the layers to 400° C., allowing the elements to interdiffuse and combine. Until the annealing process, no compound formation takes place.

The disadvantages of this prior art electrodeposition process, such as that disclosed in Kapur, involve both the electrodeposition of bulk phases of the individual elements and the need for a subsequent anneal after the electrodepostion. The anneal is required for the combination of the elements to form the compound. Difficulties can arise in obtaining an ordered single-crystalline deposit homogeneously throughout the whole deposit, since compound formation relies on the interdiffusion of the two elements. The annealing step is especially disadvantageous if a heterojunction device is fabricated with the art, since diffusion across junctions increases with temperature.

Another example of the state of the art in the electrodeposition of compound semiconductors is disclosed in U.S. Pat. No. 4,400,244 issued to Kroger et al. Kroger teaches that compound semiconductors can be electrodeposited through codeposition. In other words, by combining both elements in a single solution and selecting an optimum potential for deposition, a stoichiometric deposit can be achieved. This method utilizes the underpotential deposition (UPD) of one of the elements. UPD is the energy advantage afforded by formation of a compound on the surface. In order to limit the deposit composition to nearly a 1:1 stoichiometry, the potential for deposition is selected so that bulk Cd is not formed, and that Cd will only deposit onto previously deposited Te. The concentration of $TeO_2$ is kept much lower than that of $Cd^{+2}$ so that deposition of Te is the limiting step. All deposited Te is quantitatively reacted with the excess of $Cd^{+2}$ ion.

The disadvantages of this prior art electrodepostion process lie in the resulting deposit structure. Although the stoichiometry is satisfactory, the structure of the deposits is usually polycrystalline, frequently having very convoluted morphologies. This generally results due to a lack of control over the rates of nucleation and growth of the deposits. Three-dimensional nuclei are formed and result in three-dimensional growth and polycrystallinity. Epitaxial electrodeposition is desired and necessitates suppression of these nuclei.

There are a wide variety of applications for compound semiconductors. For example, they are used in photovoltaics, luminescent displays, radiation detectors, lasers and laser windows, infrared detectors, and Vidicon imaging devices. Compound semiconductors are the central components in emerging electro-optical technologies based on layered structures. They display a variety of band gaps and some form solid solutions. The ability to control stoichiometry in these solid solutions results in the ability to vary the band gap as a function of its composition. The mercury-cadmium-telluride (MCT) system is an important example of band gap engineering.

Electrodeposition of semiconductors is a potential low cost, room temperature production technique. All previous work in compound semiconductor electrodeposition has resulted in polycrystalline deposits. There are four primary reasons for the formation of polycrystalline deposits: three-dimensional nuclei formation; the absence of an ordered substrate structure; the absence of a lattice match between substrate and deposit; and substrate, solvent, reactant and electrolyte contamination. To date, these problems have not been overcome.

Vacuum-based methods for compound semiconductor growth (e.g., molecular beam epitaxy (MBE) or vapor phase epitaxy (VPE)) involve some of the same problems encountered in electrodeposition, such as the need for careful control of reactant fluxes in order to obtain epitaxial deposits. Atomic layer epitaxy (ALE) represents a group of techniques currently under development which allow less stringent control of such growth parameters. An example of the state of the art of atomic layer epitaxy is disclosed in U.S. Pat. No. 4,058,430 issued to Suntola et al. Unique to ALE is compound growth one atomic layer at a time. These techniques rely on surface-specific, self-limiting reactions, which result in only an atomic layer of reactivity. If the reactant is an elemental vapor, the substrate temperature is adjusted so that bulk deposits sublime while the first atomic layer remains due to an enhanced stability resulting from compound formation. After evacuation of the first element, a similar procedure is performed with the second element. For a compound such as CdTe, an atomic layer of Cd is formed followed by an atomic layer of Te. Thin film growth is achieved by repeating this cycle.

SUMMARY OF THE INVENTION

The present invention is a method for electrochemically depositing semiconductors and for the electrochemical formation of epitaxial thin-film, single-crystalline compound semiconductors. This method involves the alternating electrodeposition of single atomic layers of selected pairs of elements. Limitation of the deposition to a single atomic layer of an element at a time is facilitated by depositing the elements at underpotential, generally referred to as underpotential deposition (UPD). UPD is a phenomenon whereby the potential necessary to electrodeposit a first element on a second element is different (under) than that necessary for depositing the first element on itself, if compound formation is energetically favored. Thus, by careful selection of the deposition potentials for the elements, single atomic layers can be deposited to the exclusion of bulk deposits of the element (the element depositing on itself).

The definition of an atomic layer of an element is determined by the structure of the depositing element and any compound into which it may incorporate, as well by the orientation of the compound with respect to the surface of the substrate. A single monolayer of the compound will typically consist of an atomic layer of one element and an atomic layer of the second element, for a 1:1 compound. An atomic layer of a element would thus be the same as a ½ monolayer of the compound.

Deposition occurs by exposing the substrate to a solution containing the first element at a potential where an atomic layer of the first element will deposit, and then exchanging the first solution for a second solution containing the second element and adjusting the potential so that an atomic layer of the second element deposits on the first element. This cycle of alternating deposition of the first and second elements is repeated a sufficient number of times so as to produce a layer of the compound semiconductor of the desired thickness.

In its best mode, the method of the present invention uses a pair of elements, one selected from Group IIB and the other selected from Group VIA, or one selected from Group IIIA and the other selected from Group VA. For example, the electrochemical deposition of alternating one-half monolayers of tellurium and cadmium on a gold substrate is one embodiment. Other embodiments include alternating the electrochemical deposition of Group IIB elements, such as zinc, cadmium or mercury, and Group VIA elements, such as tellurium, selenium or sulfur. Additional embodiments include alternating the electrochemical deposition of Group IIIA elements, such as gallium, aluminum, or indium, and Group VA elements, such as arsenic, phosphorus, antimony or bismuth. The most general embodiment is for any compound where at least one of the elements is selected from the elements Te, Se, S, Ge, Sn, Pb, As, Sb, or Bi, and the second element is any element which can be reductively electrodeposited with the first element to form a compound semiconductor, including other members of the group of elements listed above.

The present invention is a significant improvement over prior methods which involve the codeposition of both elements or for those methods which involve the electrodeposition of bulk layers of each element followed by an anneal. When compared to codeposition, the present invention is desirable because it prevents the formation of three-dimensional nuclei and the polycrystalline deposits which result. When compared to electrodeposition of bulk layers followed by an anneal, the present invention is a significant improvement on the prior art because it avoids the annealing step, which, besides being an extra step, causes blurring of heterojunctions. The present method is also an improvement over the prior art because it avoids the polycrystallinity which can result if the elements are deposited in bulk form. Until the present invention, it was unknown to those skilled in the art that both elements can be deposited separately at underpotential, resulting only in compound formation and in the first epitaxial electrodeposits of these compounds.

This invention discloses the application of atomic layer epitaxy (ALE) to the electrodeposition of thin film compound semiconductors in order to allow deposit structure and composition to be controlled by self-limiting processes. Control of deposit structure by nucleation and growth kinetics is deterred by limiting reactivity to one atomic layer of an element at a time. Potentials are chosen where the compound will form and bulk deposits of the element will not. Problems associated with codepositing both elements from the same solution include the need to adjust the pH, solvent, and electrolyte to keep both elements in solution at the proper concentrations and the need to find a potential which will result in the correct stoichiometry for the deposit. In the present art, the elements are deposited from separate solutions avoiding those compromises associated with codeposition solutions. Solutions are alternated along with the potentials so that solution compositions and deposition potentials used for the elements will be optimal for each element. The inventors refer to this deposition method as Electrochemical Atomic Layer Epitaxy (ECALE).

Accordingly, it is an object of the present invention to provide a method to electrochemically deposit semiconductors on a substrate.

It is also an object to provide a method for the electrodeposition of alternating atomically thick layers of elements using electrochemical atomic layer epitaxy (ECALE).

It is another object to provide a method for producing epitaxial thin-film, single-crystalline compound semiconductors using ECALE.

It is a further object to provide a method for producing compound semiconductors more efficiently and at lower costs.

It is also an object to provide a method for producing structured alloys of compound semiconductors using ECALE.

It is an object to provide a novel method for the formation of thin-film compound semiconductors and their structured alloys which does not rely on the use of high temperatures (above room temperature) for the deposit and reactants, in order to control the growth and structure of deposits.

It is yet another object to provide a method for using the energetic advantage, referred to as underpotential deposition (UPD), in the electrochemical formation of a compound by the ECALE process.

It is an additional object to provide a method for the alternating electrodeposition of elements which does not rely on a subsequent anneal for compound formation.

It is still a further object to provide a method for the alternating electrodeposition of elements which does not result in bulk deposition of the elements.

It is still another object to provide a method for the alternating electrodeposition of elements which does not result in the growth of polycrystalline deposits.

These objects and other objects, features and advantages will become apparent to those skilled in the art from the following description when taken in conjunction with the accompanying drawings and tables.

DESCRIPTION OF THE FIGURES

FIGS. 8a-8d are illustrations of the polycrystalline Au thin-layer electrochemical cell used to produce FIGS. 1-6.

DETAILED DESCRIPTION OF A PREFERRED EMBODIMENT

Figures 1A, 1B:
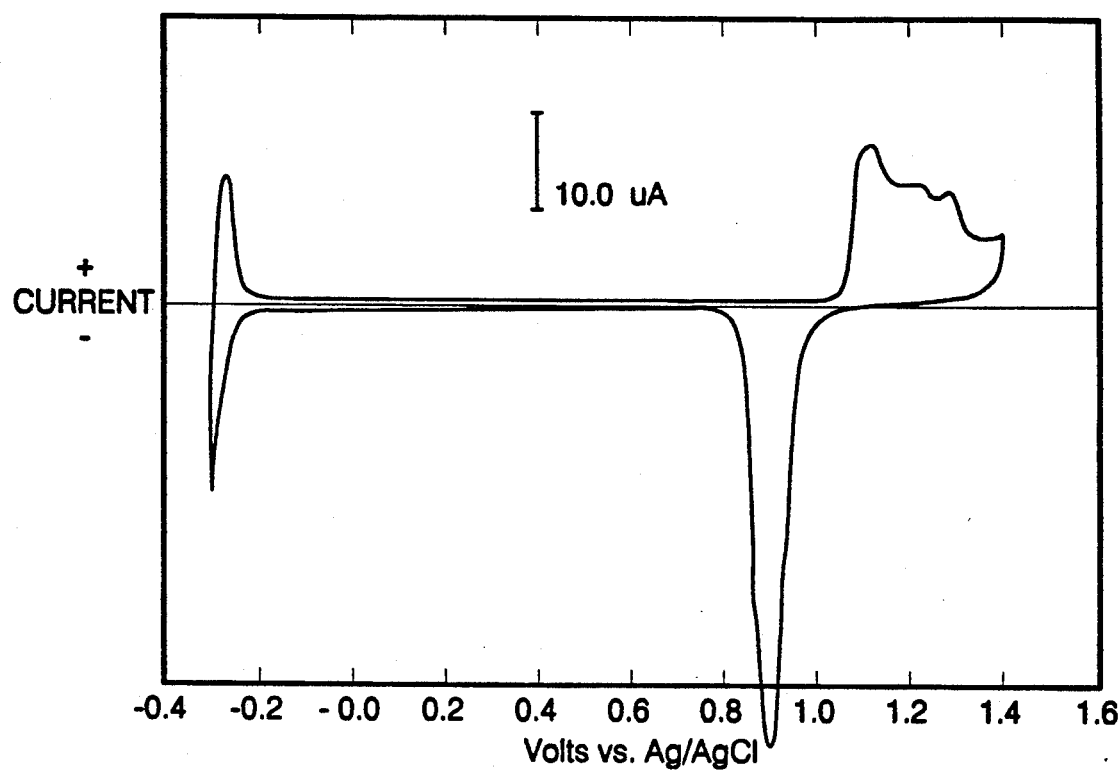
FIG. 1(a) is a current-potential curve for a clean, polycrystalline Au substrate in 1M $H_2SO_4$ using a scan rate of 5 mV/sec.
FIG. 1(b) is an illustration of the atomic structure of the Au substrate.

ECALE involves the alternated electrochemical deposition of elements to form a compound. Epitaxial deposition is achieved by using underpotential deposition (UPD) as the means to achieve self-limiting growth. The fundamental aspect of ECALE is that the compound is formed an atomic layer at a time. In this way, one component element is deposited only on the previously deposited component element, and no bulk deposition occurs. This selective deposition is facilitated by the energetics of forming a compound, the heat of formation, where the compound is more stable than the bulk elements themselves. If compound formation is thermodynamically favored, UPD potentials generally exist for which one element of the compound will deposit more easily on the second element than on itself, forming a bulk deposit. In the formation of compounds by the ECALE method, the underlying factor controlling reactivity is the electrode potential, which allows the compound to be formed spontaneously during the electrodeposition process, an atomic layer at a time.

GENERAL METHOD

The method of ECALE described herein is the electrochemical analog of atomic layer epitaxy (ALE) and, as described in more detail below, is based on the alternated electrodeposition of atomic layers of two elements at underpotential in order to form a compound. The basic premise of atomic layer epitaxy is that individual components are delivered to a substrate separately, and in a surface-limited reaction, only a single atomic layer of each element is formed on the substrate at a time. Any quantity of each element greater than a single atomic layer remaining on the substrate is then flushed or pumped away. UPD is used in the ECALE method for the deposition of both of the elements composing a compound. Most compound semiconductors consist of a metal and a main group element, such as Tellurium, Selenium, Sulfur, Germanium, Tin, Lead, Arsenic, Antimony, or Bismuth. The main group elements listed above form oxidized species which are soluble but, unlike most metals, also form soluble reduced species, such as $Te^{2-}$, $Se^{2-}$, $S^{2-}$, $Ge^{4-}$, $Sn^{4-}$, $Pb^{2-}$, $As^{3-}$, $Sb^{3-}$, and $Bi^{3-}$ which are amenable to oxidative deposition of the element, and to oxidative UPD.

The phenomena of UPD involves the deposition of one element onto a second element at a potential prior to (under) that required for deposition of the first element on itself. Classically, UPD involves the reductive deposition of a less noble metal onto a more noble metal. The driving force for UPD is formation of a compound which is energetically favored relative to the bulk elements with a stoichiometry defined by the surface chemistry of the substrate or deposit. With metals, two-dimensional bimetallic compounds are formed. This driving force can also come from formation of other types of compounds. UPD can refer to processes such as the adsorption of hydrogen on a metal, as in the hydrogen waves on Pt, or anodic processes such as the initial stages of oxide formation on metals, or halogen deposition on a metal from a halide solution.

The ECALE method is novel in its use of separate solutions for the electrodeposition of atomic layers of each element, or reactant. In this way, mass-transport control of the deposition rate is avoided. Solutions containing a single reactant are exposed to the deposit surface or substrate for a time sufficient to equilibrate. The substrate is exposed to the solution at a potential where UPD of the element occurs to form the compound, with the exclusion of bulk deposition. Therefore, the solution composition for each reactant may be chosen to optimize the deposition of the component element contained in the solution.

Figure 9:
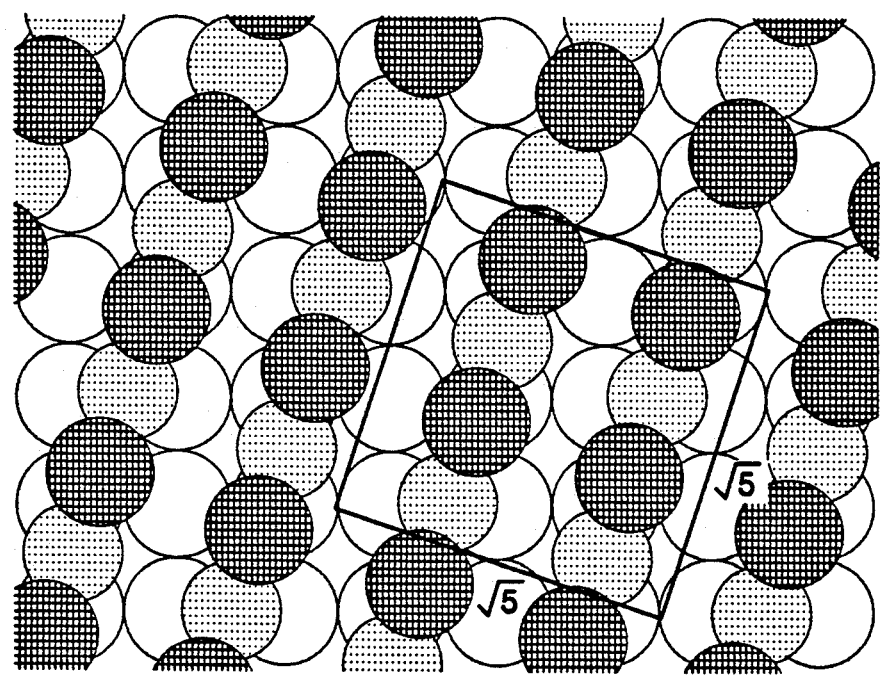
FIG. 9 is a diagram of a single layer of CdTe on an Au(100) surface. The coverage of both Cd and Te are 2/5 of a monolayer.

In this specification, deposition will be referred to in terms of atomic layers, wherein, for example, an atomic layer of the Group IIB component and an atomic layer of the Group VIA component would be combined to form a full ML of a Group II/Group VI compound. The use of the designation, or nomenclature, atomic layer is used to represent all layers which are one atom in thickness. These layers can have a variety of coverages or packing densities (atoms/cm$^2$). A full monolayer would be defined relative to the number of surface atoms per cm$^2$ of the substrate. In other words, a full monolayer results when there is one deposited atom for every substrate surface atom. For example, in the formation of a compound such as CdTe, deposition of a full monolayer of Cd or Te would be excessive, and would result in some bulk formation, thereby being over an atom thick. The formation of a single non-reconstructive layer of CdTe on a gold substrate would require atomic layers corresponding to coverages of two-fifths of a monolayer of Te and two-fifths of a monolayer of Cd. FIG. 9 illustrates the structure resulting from this deposition, showing the lattice-matched deposition of cadmium telluride forming a ($\sqrt{5} \times \sqrt{5}$)R26.6° unit cell on Au(100). Therefore, depositing a full monolayer of Te would result in over twice as much Te as necessary. The use of the designation, or nomenclature, monolayer when referring to the compound semiconductor of the present invention is used to represent two successively deposited atomic layers of alternate elements.

Compounds can be formed by sequentially depositing a Group VIA atomic layer followed by a Group IIB atomic layer. A thin-layer electrochemical (TLE) cell configuration is used for the deposition so that solutions are easily changed by blowing out one solution and allowing a second to flush in by capillary action (FIG. 7). This process is referred to as a "rinse." The use of two different reactant solutions, and a pure electrolyte to rinse with inbetween, avoids complications present with codeposition of the elements and allows a single reactant species to be deposited at a time. Those problems encountered with codeposition methods are associated with having to keep both species in the solution, which puts constraints on what electrolytes, complexing agents, and pH values the solutions can have. To limit the reactivity to an atomic layer at a time, deposition potentials are selected for UPD. This process avoids formation of three-dimensional crystallites and Stranski-Krastanov growth.

A wide variety of electrode substrates may be used in ECALE, depending on the elements selected to be deposited. The electrodes may be composed of any material that is stable at the potentials used for deposition of the compound. The various substrates appropriate for different semiconductor elements are known in the field of thin-film fabrication and in the electronics industry. A brief list of suitable materials, which is by no means exclusive, includes gold, copper, silver, platinum, various compound semiconductors, carbon, and less noble metals. In some instances a rough metal surface substrate will be needed, in others a smooth surface will be needed, while in still others a substrate which is lattice-matched with the semiconductor deposit, such as another semiconductor, will be required. In any event, the nature of the substrate will be particular to the deposited semiconductor compound, the desired compound structure and the desired structure of the resulting device being fabricated. In other words, for any given semiconductor compound, the end use will dictate the substrate used. For example, in the case of solar cells, polycrystalline deposits are tolerable and thus rougher substrates are suitable. However, in the case of electronic grade semiconductor thin films, lattice-matched substrates and state-of-the-art surface treatments must be used.

Regarding the specific materials used in ECALE, various solvents, gases and electrolytes may be used. For example, although water is a preferred solvent, nonaqueous solvents may be desirable depending on the reactant element involved. Gases used for solution purging or for delivering reactant solutions to the substrate should be inert, and include, for example, nitrogen and the noble gases, such as helium, neon, argon, krypton, and xenon. Gases which are used as reactant gases include the hydrides of the Group IV and VI elements, such as $H_2Te$, $H_2Se$, $H_2S$, $H_3As$, $H_3Sb$ and $H_3P$, which might be dissolved in a solvent so as to be used as reactants.

Any electrolyte that will work with the reactant elements can be used. As each element is deposited from a different solution, the choice of electrolyte is a function of what pH is desired, what solvent is used, and what electrolyte is compatible with the reactant element. For example, when using an aqueous solvent, electrolytes such as any sulfate, borate, nitrate, chloride, bromide or iodide salt, with cations such as $H^+$, $Na^+$, $Li^+$, $K^+$, $Rb^+$ or $Cs^+$, should work, as well as various other electrolytes compatible with the particular reactant elements.

Figure 7A:
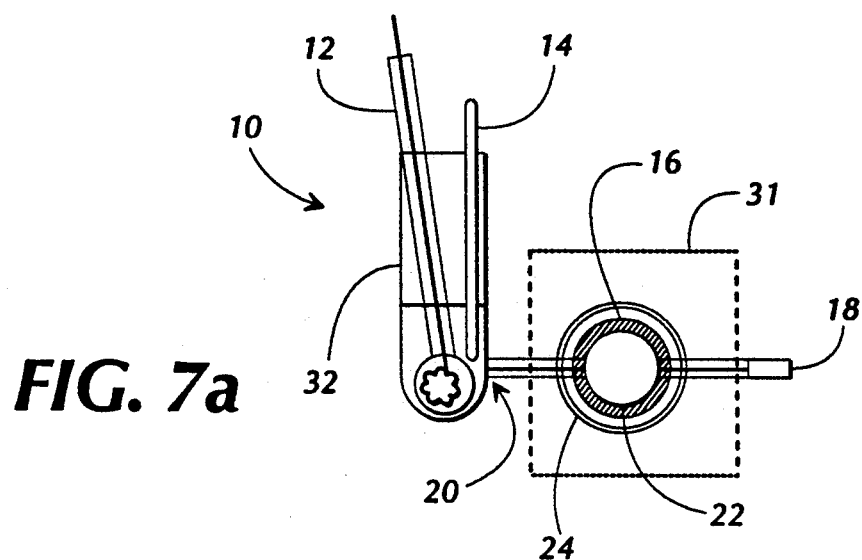
FIGS. 7a-7d are illustrations of a thin-layer electrochemical cell configuration which can be used for ECALE.
Figure 7C:
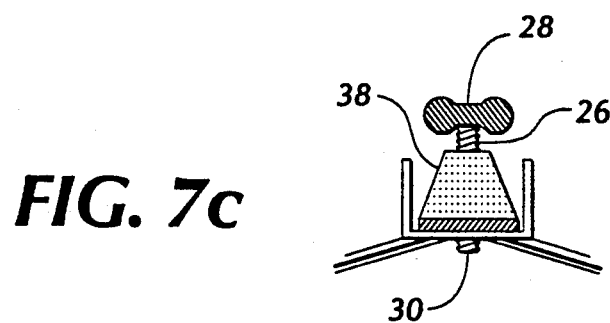
Figure 7D:
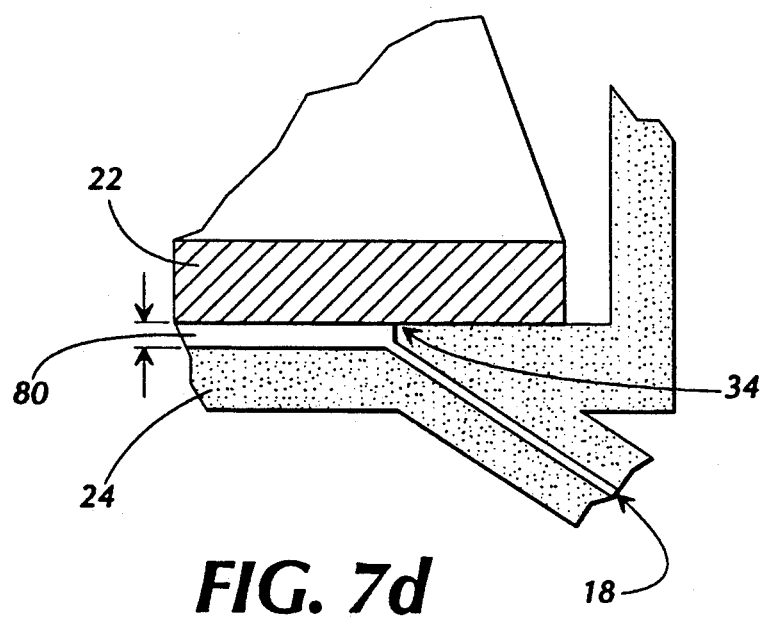

A thin-layer electrochemical flow cell (TLE Flow Cell) 10 developed for this invention is shown in FIG. 7a, with the thin-layer cell 31 being enlarged to show detail. The TLE flow cell 10 comprises two sections, a thin-layer cell 31 and a reference electrode compartment 32 connected in series in the line of solution flow. The reference electrode compartment 32 contains the reference electrode 12 and an auxiliary electrode 14. The thin-layer cell 31 contains the substrate 22 onto which deposition by the ECALE method will occur. The substrate 22 is held against the glass cell wall 24 by a clamp 26. The solution gap between the substrate 22 and the cell wall 24 generally is on the order of 0.002 inches thick.

In operation, potentials are applied between the substrate 22 and the reference electrode 12. A first reactant solution is introduced to the cell 31 through inlet 18. As the first reactant solution enters solution gap 80, it comes into contact with the substrate 22, and is prevented from seeping around substrate 22 by seal 34. The seal 34 can be a knife edge which cuts into the substrate or it can be a sealing material such as Teflon. The potential difference between the substrate 22 and the reference electrode 12 causes an atomic layer of the first reactant element contained within the first reactant solution to electrochemically deposit on the substrate.

The first reactant solution exits the cell via outlet 20 and moves into the reference electrode compartment 32, contacting the reference electrode 12, thus allowing control of the substrate 22 potential. After a layer of the first reactant element has been deposited on the substrate, the first reactant solution is pushed out of the cell 31 either by a pure electrolyte solution rinse or by the second reactant solution. It is preferable to use a pure electrolyte rinse to remove the first reactant solution so that the second reactant solution is not contaminated by the first reactant solution. After the first reactant solution has been pushed out of the cell 31, the second reactant solution containing a second reactant element is introduced to the cell 31 in the same manner as the first reactant solution discussed above. A second potential is applied between the substrate 22 and the reference electrode 12 causing an atomic layer of the second reactant element to be electrodeposited on top of the previously electrodeposited first reactant element on the substrate 22. This process is repeated any number of times alternating between reactant solutions so as to deposit alternate atomic layers of reactant elements. In this manner, the alternated electrodeposition of atomic layers of two elements at underpotential in order to form a compound is achieved.

Figure 7B:
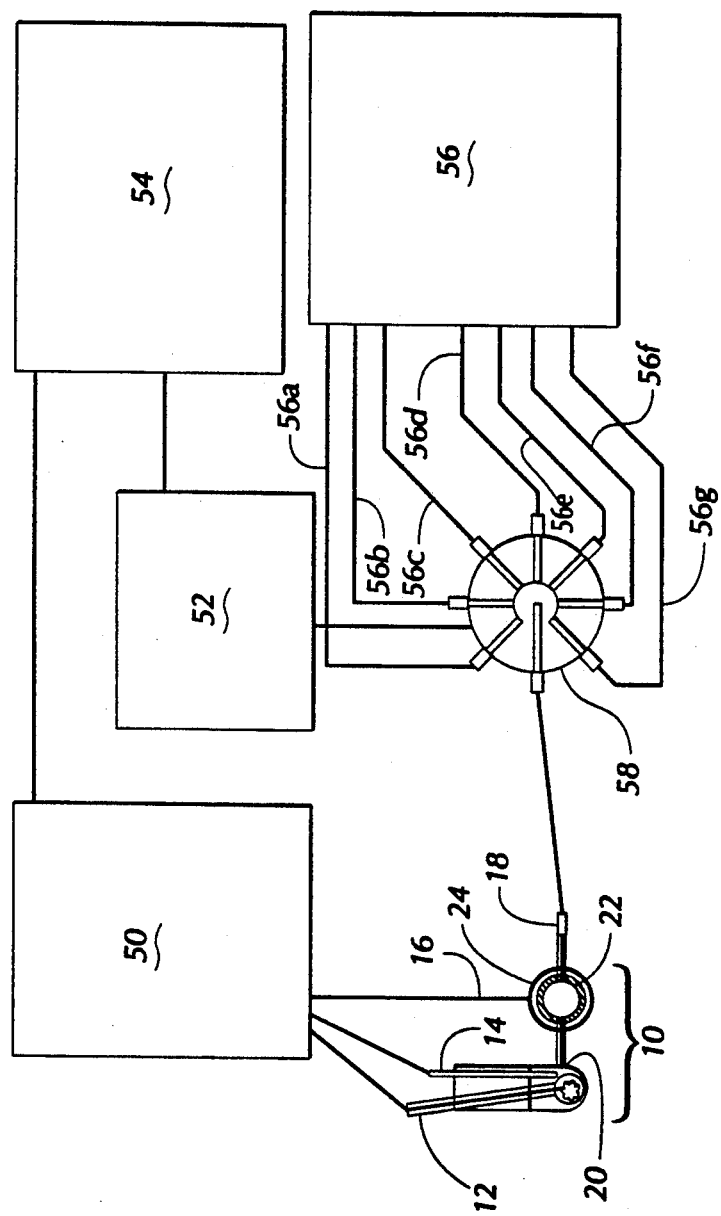

In FIG. 7b, an automated, computer-controlled thin-layer flow cell system is diagrammed, incorporating the thin-layer flow cell shown in FIG. 7a. Various reactant solutions are stored in solution reservoirs 56 which are connected to a distribution valve 58 through various solution feedlines 56a-g. The distribution valve 58 is controlled by a valve controller 52 which in turn is controlled by an AT compatible computer 54. The computer 54, through a potentiostat 50, also controls and monitors the deposition process. The computer 54 selects the proper potentials and causes the potentiostat 50 to apply these potentials to the substrate 22. The computer 54 then instructs the valve controller 52 to move the distribution valve 58 to a setting that allows a desired reactant solution to move from the solution reservoirs 56 through the distribution valve 58 and into the cell 31. In this manner, any of a number of reactant solutions can be introduced in any desired order to the cell 31. For example, the computer 54 can instruct the valve controller 52 to cause the distribution valve 58 to first allow the passage of a first reactant solution from solution reservoirs 56 through feedline 56b through distribution valve 58 into the cell 31. After the first reactant element in this first reactant solution has been electrodeposited on the substrate 22, the computer 54 can then instruct the valve controller 52 to reposition the distribution valve 58. This will allow a second reactant solution to move from the solution reservoirs 56, through feedline 56e and the distribution valve 58, into the cell 31. As is obvious, any number of reactant solutions may be used in this configuration, and any order of introduction of solutions to the cell 31 can be achieved.

The particular thin-layer electrochemical (TLE) cell 110 used in the experimental examples described below is shown in FIG. 8a. The glass casing 131 is an elongated Pyrex tube having a lower cell wall 124 with a smaller inner diameter, which encases the indicator electrode 116. An inlet 130 for an inert gas, such as argon, allows the thin layer of solution surrounding the indicator electrode 116 to be forced out of the cell compartment through the pin hole 118. A thin wire 128, generally platinum, makes electrical connection to the indicator electrode 116.

FIG. 8b shows an enlargement of the lower portion of the glass casing 131 showing in greater detail the electrode compartment where ECALE takes place. The indicator electrode 116 is supported within the cell wall 124 such that a solution gap 180 is created between the indicator electrode 116 and the cell wall 124. FIG. 8d shows an enlargement of the solution gap 180 area of the electrode compartment. The solution gap 180 generally is about 0.001 inches thick. Reactant solution flows into and out of the solution gap 180 through a pinhole 118 in the glass casing. There are two pinholes 118 located on opposite sides of the cell from each other. FIG. 8c shows the TLE cell 131 in FIG. 8a housed in a standard electrochemical H-cell 133. A reference electrode compartment 132 containing the reference electrode 112 and an auxiliary electrode 140 is separated from the TLE compartment 134 via a 10 mm fine frit 135. An inlet 136 for an inert gas, such as argon, allows the solution contained in the TLE compartment 134 to be purged of dissolved oxygen.

In operation, a potential is created between the reference electrode 112 and the indicator (substrate) electrode 116, as discussed above for the TLE cell 10. For multiple solutions, multiple H-cells 133 are used; each solution is housed in a different H-cell 133. To fill the solution gap 180, the TLE 110 is placed in an H-cell containing the desired solution so that the pinholes 118 are immersed in the solution. Pressurizing the TLE 110 with high purity inert gas through inlet 130 expels any solution previously contained in the solution gap 180 through the pinholes 118. Removal of the over-pressure allows the solution gap 180 to fill, by capillary action, with the first reactant solution through the pinholes 118. The potential difference between the indicator (substrate) electrode 116 and the reference electrode 112 results in the deposition of an atomic layer of the element contained within the reactant solution. The amount deposited is determined by the potential, and is chosen so that a UPD amount results. The rest of the first reactant solution is then blown out of the solution gap 180 by again pressurizing with high purity inert gas through inlet 130. The solution again leaves through the pinholes 118. The TLE 110 is then transferred to a second H-cell containing a pure electrolyte or a second reactant solution. This solution is then allowed to fill the solution gap 180 by depressurizing the TLE 110. With the second reactant solution in the solution gap 180, a second potential is applied between the indicator (substrate) electrode 116 and the reference electrode 112 and an atomic layer of the second element is deposited. The solution is then removed by pressurizing the TLE 110 with high purity inert gas. This process is repeated any desired number of times to achieve the alternated electrodeposition of atomic layers of two or more elements at underpotential in order to form a thin film compound.

The thin-layer electrode cavity shown in FIG. 8a and used in the experimental example described below has a volume of approximately 3.0 µL, although any low volume cavity that has less than approximately 200 µL/cm$^2$ of electrode surface area is appropriate. The best volume for such cavities ranges from about 1 µL/cm$^2$ to about 50 µL/cm$^2$. Larger volumes can be used, but they would be wasteful of solution and would potentially subject the substrate to a greater amount of contamination.

In general, the two elements to be electrodeposited are selected, one usually a metal and the other from the VA, VIA or IV groups: Te, Se, S, Ge, Sn, Pb As, Sb or Bi. The first element is electrodeposited, using an electrodepositing apparatus, onto a substrate at a deposition potential chosen such that a specific amount of the element (an atomic layer) results. Once the first element is deposited onto the substrate, the electrodepositing apparatus is rinsed to remove traces of the first element from the apparatus. The second element then is electrodeposited using the electrodepositing apparatus over the first element. The amount of the second element deposited corresponds to the amount of the first element deposited. In other words, if 2/5 monolayer of the first element is deposited, 2/5 monolayer of the second element is deposited. This occurs as a natural phenomenon or consequence since the second element attaches only to sites corresponding to the first element. Therefore, after the layer coverage is determined by selection of the deposition potential for the first element, each successive layer will have an equivalent coverage. Alternate layers of the first and second elements are deposited until a film of the desired thickness for the compound semiconductor thin film is achieved.

The higher the purity, the better the result. Contamination is minimized by control of the purity of each solution component. Use of ultrahigh purity solvents, gases, electrolytes, and reactants in a high surface area/low volume thin-layer electrochemical cell (TLE) configuration will help to minimize contamination (See FIG. 7). The very low solution volume-to-electrode surface area ratio (3 $\mu$/cm$^2$) of the TLE results in a $10^3$–$10^4$ decrease in the amount of solution exposed to the deposit at a given time, compared with conventional deposition configurations. A decrease in the solution volume results directly in a decrease in the quantity of contaminants exposed to the deposit surface.

Previous low temperature studies of compound semiconductor electrodeposition have been performed on polycrystalline substrates. This invention also involves polycrystalline substrates, but it is clear that well-characterized single-crystal substrates are desirable and that epitaxial deposition will occur most readily on an ordered, lattice-matched substrate. The experiments leading to this invention were carried out using polycrystalline electrodes in order to determine the potentials and general coverages relating to the ECALE of CdTe (FIG. 8). ECALE of CdTe on single-crystal substrates is more suitable for the epitaxial electrodeposition of single-crystalline thin-film compound semiconductors. Thus, it is desirable to carefully select, prepare and characterize lattice-matched single-crystal substrates in order to avoid interfacial strain and promote ordered deposition.

EXPERIMENTAL EXAMPLE

The thin-layer electrochemical cells (TLE's) utilized are shown in FIG. 8. The Au electrode was a polycrystalline rod, finished with 600 emery paper. It was initially flame-annealed for 10–15 seconds in a gas/O$_2$ flame, resulting in a dim red glow, then immediately quenched in triply-distilled water. Afterwards, the electrode was etched in concentrated nitric acid (Baker Analyzed Reagent) for approximately 5 seconds. Prior to each electrochemical experiment, a standard cleaning procedure was performed which consisted of cycles of oxidation and reduction in 1M H$_2$SO$_4$. During each cleaning cycle, the electrode cavity was flushed with 10 rinses of fresh H$_2$SO$_4$ solution at both the oxidizing and reducing potentials. Following the cleaning cycles, a clean current-potential curve for Au was obtained in 1M H$_2$SO$_4$, equivalent to that shown in FIG. 1(a). All potentials are reported using an Ag/AgCl (1M NaCl) reference electrode.

Cadmium solutions were prepared using CdSO$_4$ (Alfa ultrapure anhydrous and Morton Thiokol, 99.6%), NaClO$_4$ (Fisher Scientific, Purified, Cat. No. S360-500), and HClO$_4$ (Baker Analyzed Reagent, 60–62%). Tellurium solutions were prepared with Puratronic TeO$_2$ (Johnson Matthey, 99.9995%) and HClO$_4$. The concentrations of the actual solutions used were: 1.0 mM CdSO$_4$+1M NaClO$_4$ (pH=2.9); 0.505 mM TeO$_2$+0.10M HClO$_4$+1M NaClO$_4$ (pH=1.3); and 1M NaClO$_4$ (pH 2.5). Pryolytically triply-distilled water was used to prepare all solutions.

The results discussed below are reported as the ratio of deposited atoms/substrate surface atoms. The number of Au substrate surface atoms was obtained from measurements of the real surface area. This was accomplished by integration of the charge required to reduce IO$_3^-$ formed by oxidation of a close-packed monolayer of absorbed iodine atoms. Iodine atoms adsorb spontaneously on clean Au from a 1 mM KI solution to form a close-packed layer. This method yielded a value of 1.29 cm$^2$.

The volume of the Au TLE cavity was determined using the charge for reduction of an aliquot of a 4.81 mM FeCl$_3$/1.0M H$_2$SO$_4$ solution. The calculated volume was 2.90 $\mu$L.

Results

Au electrodes were selected for this invention because of their large double-layer region (i.e., the potential region between −0.20 and 1.05 V vs. Ag/AgCl (FIG. 1(a)) where no surface-specific faradaic processes occur), in 1M H$_2$SO$_4$. It should not be concluded that Au is the best substrate for forming these deposits; Au is simply well-suited for observing the electrochemistry of Cd and Te in this experimental example. Epitaxy will be much better facilitated if well-ordered lattice-matched single-crystal electrodes are used as substrates. Au(100) single-crystal surfaces do offer a close lattice matching possibility for CdTe. Formation of a Au(100)(5×5)R26.6° unit cell at the interface results in only a 0.6% mismatch with CdTe (FIG. 9).

FIG. 1(a) displays the voltammetry of the clean Au TLE. This surface was reproducibly obtained before each experiment by application of cleaning cycles, which consisted of alternated rinsing with pure 1M H$_2$SO$_4$ at −0.5 V and +1.4 V. The Au electrode was thermally annealed in a gas/oxygen flame after polishing and prior to use.

FIG. 1(b) represents a side view of the Au substrate surface. Measurements of the electrode surface area, including roughness factor, were made by quantitating the amount of iodine atoms absorbed upon exposure of the clean electrode to three aliquots of 1 mM KI. Previous studies of iodine atom adsorption on Au(111) using low energy electron diffraction and Auger electron spectroscopy showed that iodine formed a (5×3) unit cell at a coverage of 0.4 (i.e., 4 iodine atoms per 10 Au substrate atoms). Thus, there are 5.4×10$^{14}$ I atoms/cm$^2$ for a close-packed I atom layer on the Au(111) surface. Using this number and the integrated charge for adsorbed iodine oxidation, the electrode surface area was determined to be 1.29 cm$^2$, corresponding to a roughness factor of 1.04 (the ratio of real surface area to geometric surface area).

Figure 2A:
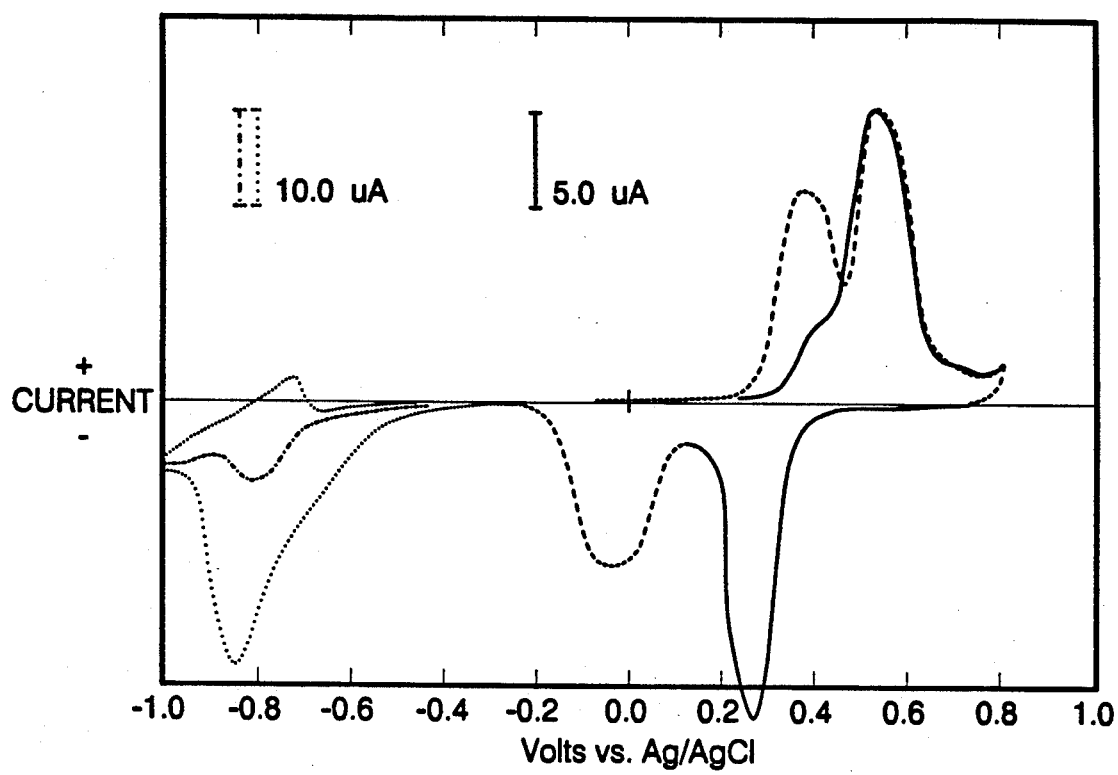
FIG. 2(a) is a current-potential curve for Te deposition and stripping on a polycrystalline Au substrate using a scan rate of 5 mV/sec in which: the solid curve represents deposition and stripping of the Te UPD layer; the dashed curve represents deposition and stripping of the bulk Te deposit; the dotted curve represents reduction of bulk Te and excess $H^+$ to $H_2Te$ and $H_2$, respectively, followed by reoxidation of $H_2Te$ to Te at $-0.75$ V during an anodic sweep; and the dash-dot curve represents a reverse cathodic sweep showing re-reduction of Te to $H_2Te$ without the presence of $H^+$ reduction.

The first step in the deposition process was to rinse into the Au TLE an aliquot (2.90 μL) of 0.5 mM $TeO_2$ at 0.8 V. Initial Te deposition is considerably different than subsequent layers since Te is depositing on Au. FIG. 2(a) represents the voltammetry of the Te deposition. The scan proceeded from right to left and resulted in a reduction peak at 0.25 V which corresponded to the UPD of Te onto Au. A coverage of 0.49 monolayers for the Te UPD peak was calculated using the electrode surface area and the charge associated with the peak. It is known that the cessation of Te deposition current indicates that either the surface is covered or all available surface sites have been filled.

Continuation of the reductive scan resulted in a second peak corresponding to deposition of bulk Te (i.e., deposition of Te on itself). The amount of bulk deposition was limited due to the finite amount of $TeO_2$ originally present in the TLE cavity, and thus appears as a peak. The charge under these first two peaks corresponds to deposition of the total $TeO_2$ aliquot by a 4-electron reduction to Te(O).

By stopping the scan after the first peak and rinsing in pure supporting electrolyte, the excess $TeO_2$ is removed. This procedure leaves a single atomic layer of Te on the substrate surface, which is diagrammed in FIG. 2(b). The solid stripping curve in FIG. 2(a) is observed in the reverse scan. Stripping curves are shown in each figure as a way of monitoring deposited amounts of Cd and Te. The dashed curve in FIG. 2(a) corresponds to deposition and stripping of bulk Te.

The dotted curves shown in FIG. 2(a), at negative potentials, were obtained after deposition of both UPD and bulk Te. The first cycle involves two processes: reduction of $H^+$ to $H_2$ and reduction of Te to $H_2Te$. On the subsequent oxidative scan, a single small peak is observed for the oxidation of $H_2Te$ back to Te. Hydrogen is not reoxidized at these potentials because the electrode is still well below the reversible hydrogen potential. The fact that protons were not reduced until −0.8 V in the first reduction scan demonstrates a larger overpotential for hydrogen formation on Te-covered Au as compared to clean Au. The second cycle shown in FIG. 2(a) shows considerably less hydrogen formation since the pH in the thin layer cavity was substantially increased by the first reduction scan. The reduction of Te to $H_2Te$ is clearly visible at −0.82 V.

If the TLE is rinsed with pure electrolyte at −0.85 V, the $H_2Te$ is removed. A subsequent positive scan shows no $H_2Te$ oxidation at −0.75 V, but a peak for Te UPD oxidation is observed at 0.55 V, equivalent to the solid curve in FIG. 2(a). This indicates that Te is UPD-stabilized relative to $H_2Te$ formation on the Au surface and only the excess, or bulk, Te is converted to $H_2Te$. Thus, there are multiple ways to obtain an atomic layer of Te on Au: reduction of $TeO_2$ with removal of excess $TeO_2$ at 0.15 V; or deposition of the complete $TeO_2$ aliquot at −0.3 V with subsequent reduction of the excess Te to $H_2Te$ at −0.85 V, followed by rinsing away the $H_2Te$ with pure electrolyte. An important variation on the latter procedure is to rinse in the $TeO_2$ solution initially with the electrode potential at −0.85 V. The result is reduction of all the $TeO_2$ to Te with further reduction of the excess, or bulk, Te to $H_2Te$. This latter method is the method of choice for the formation of thin films requiring multiple cycles.

Figure 3A:
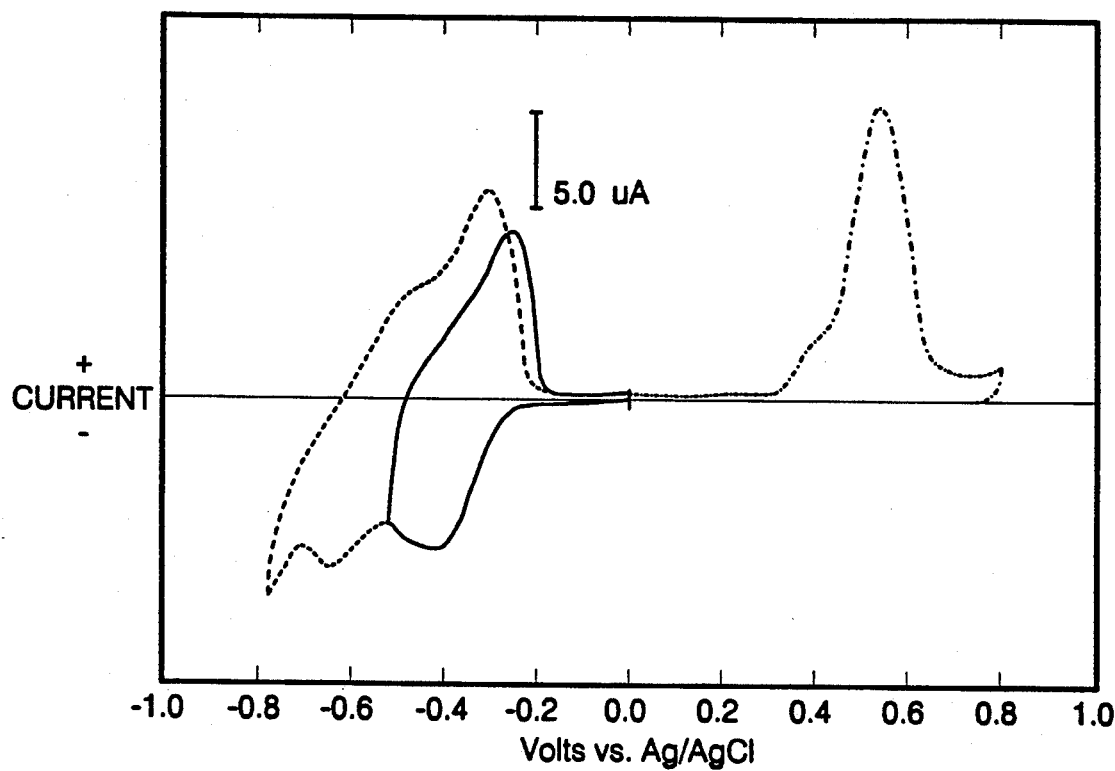
FIG. 3(a) is a current-potential curve for underpotential deposition of Cd on a UPD Te-covered Au substrate using a scan rate of 5 mV/sec in which: the solid curve represents deposition and stripping of UPD Cd; the dashed curve represents deposition of the remainder of the $Cd^{+2}$ aliquot, followed by stripping of the resulting Cd deposit; and the dash-dot curve represents stripping of the Te UPD layer.

Deposition of Cd on Te-covered Au is shown in FIGS. 3(a) and (b). A broad UPD process occurs (>0.5 V), which manifests itself as two peaks when using this low mM Cd concentration. Stopping the scan after the first peak, at −0.50 V, resulted in a coverage of 0.45 monolayers, which is approximately equivalent to the Te coverage. Excess $Cd^{+2}$ was then removed by flushing with pure electrolyte at −0.68 V. This more negative rinsing potential was required so that the deposited Cd would not spontaneously dissolve in the rinsing solution where the activity of $Cd^{+2}$ was minimal.

Also evident in FIG. 3(a) is the variability in the amount of deposited Cd accompanying variations in the deposition potential. Multiple UPD peaks can result from a polycrystalline substrate where different peaks correspond to deposition on different planes. Multiple peaks can also correspond to changes in deposit structure if the packing density is increased as the potential is decreased. The deposition was ended at −0.56 V since it resulted in nearly equivalent coverages of Cd and Te.

Figure 3B:
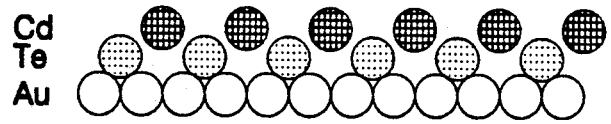
FIG. 3(b) is an illustration of the atomic structure of ½ ML Cd and ½ ML Te on the Au substrate.

The solid line in FIG. 3(a) shows the stripping of the Cd layer. The subsequent stripping of the Te UPD is shown as the dot-dashed line. UPD Cd deposition is diagrammed as an atomic layer on top of the previously deposited Te in FIG. 3(b). The most important factor in determining the potential at which to deposit Cd is the prevention of bulk Cd formation, and thus the prevention of three-dimensional nucleation.

Figure 2B:
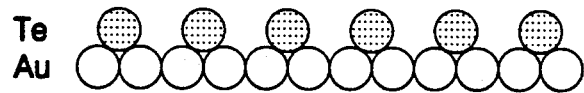
FIG. 2(b) is an illustration of the atomic structure of one-half monolayer (½ ML) Te on the Au substrate.
Figure 4A:
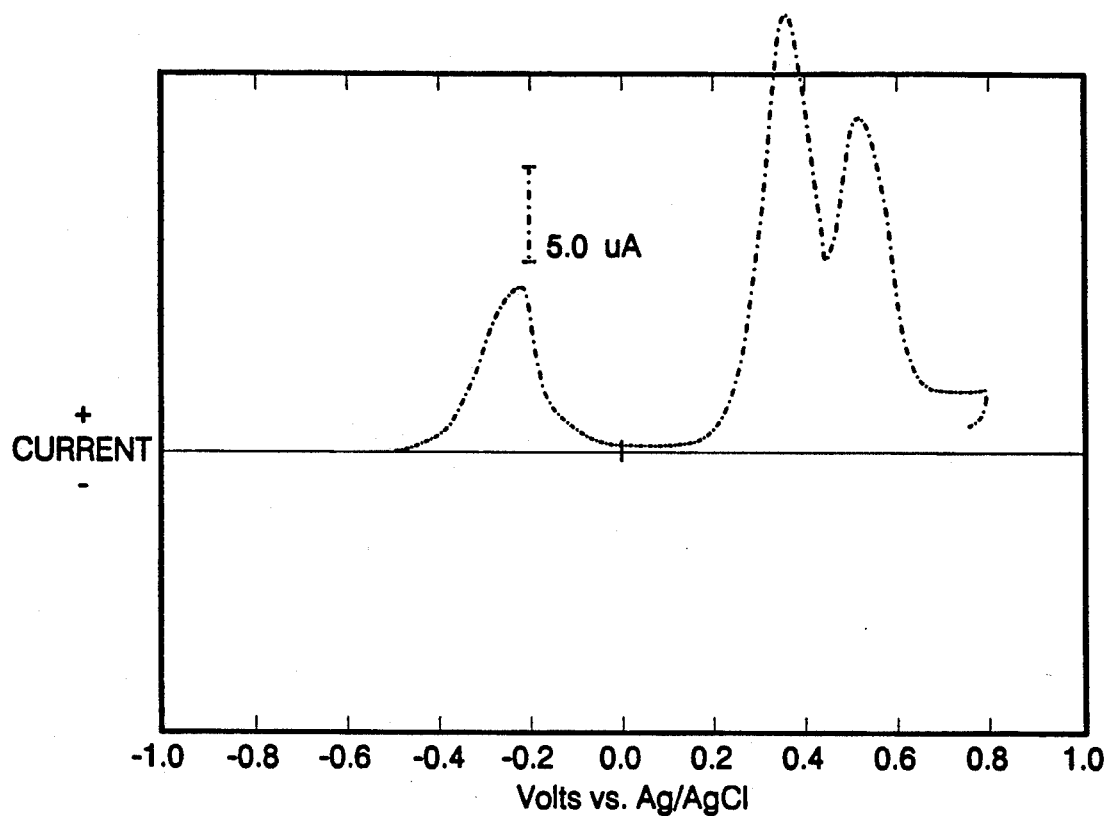
FIG. 4(a) is a current-potential stripping curve following deposition of excess Te on top of previously deposited Cd using a scan rate of 5 mV/sec.
Figure 5A:
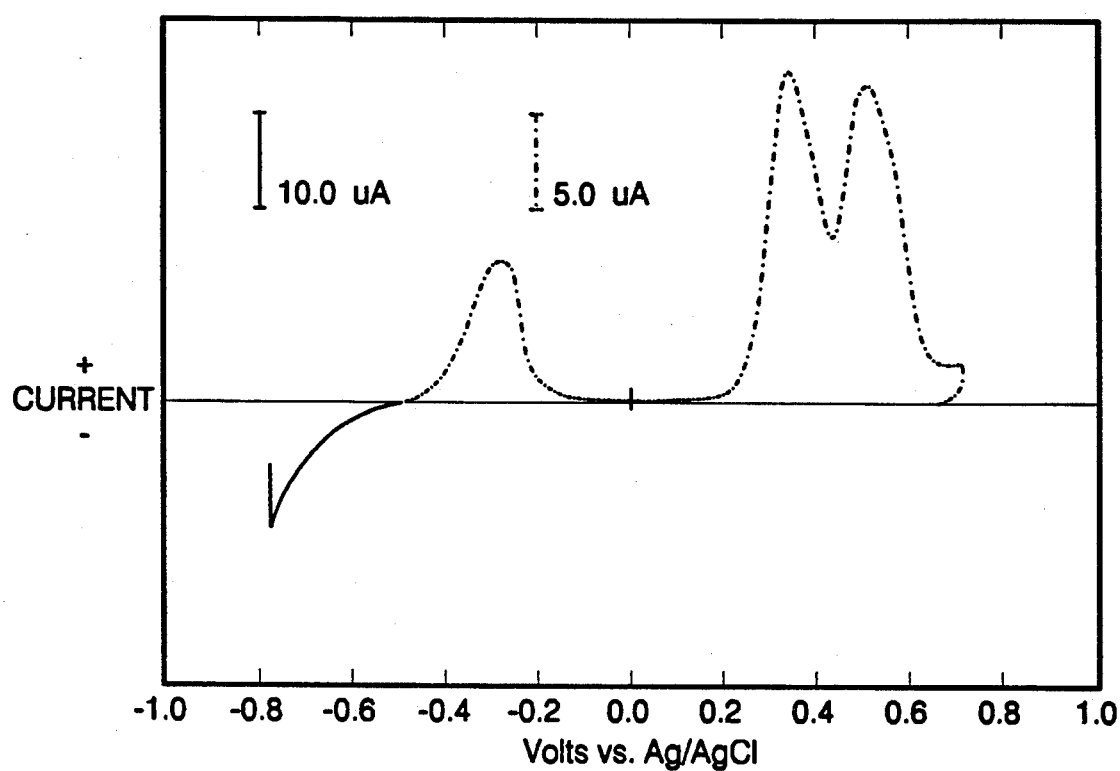
FIG. 5(a) is a current-potential stripping curve following removal of bulk Te via the reductive formation of soluble $H_2Te$ using a scan rate of 5 mV/sec in which: the solid curve represents a cathodic scan to potential where $H_2Te$ formation occurs, followed by rinsing $H_2Te$ out of TLE cell; and the dash-dot curve represents stripping of the remaining deposit, showing a decrease in the size of the bulk Te stripping peak (compared to FIG. 4(a)).
Figure 5B:
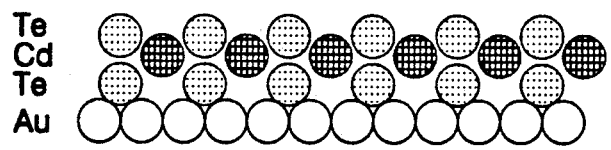
FIG. 5(b) is an illustration of the atomic structure of the structure of FIG. 4(b) following the removal of excess Te.

The next layer of Te cannot be deposited by scanning reductively from 0.8 V (See FIG. 2(a)) since both the previously deposited Cd and Te would be stripped at that potential. To keep these two components on the surface, the potential must be kept below −0.45 V. One method for forming the next Te layer involves first depositing a full aliquot of $TeO_2$ at −0.5 V so that UPD and bulk Te result, followed by reduction of the bulk Te, forming soluble $H_2Te$. FIG. 4(a) shows the stripping scan which results after a single rinse of the CdTe-covered Au electrode in $TeO_2$ solution at −0.5 V, following FIG. 3. The oxidative peak at −0.20 V corresponds to Cd stripping, and the two peaks at 0.35 V and 0.55 V correspond to bulk Te and UPD Te stripping, respectively. The bulk peak is offscale, indicating that this deposition results in more than a doubling of the original UPD peak shown in FIG. 2(a). The amount of Te deposited was a function of the concentration of the $TeO_2$ aliquot and was sufficient to deposit the second atomic layer of Te as well as some bulk Te. A negative scan from −0.45 V reduces the bulk Te to $H_2Te$, leaving only the Te in contact with the previously deposited Cd, shown voltammetrically in FIG. 5(a) and diagrammatically in FIG. 5(b). Flushing the electrode with pure electrolyte removed all $H_2Te$. The subsequent stripping scan in FIG. 5(a) demonstrates the decrease in the bulk Te peak at 0.35 V. FIG. 5(b) shows that the total Te deposited is now double the amount initially deposited as shown in FIG. 2(b).

Figure 4B:
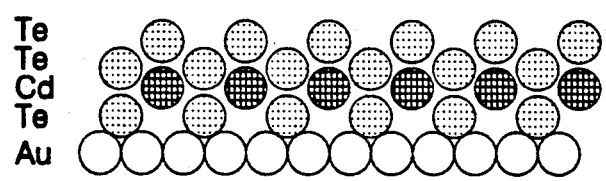
FIG. 4(b) is an illustration of the excess Te of FIG. 4(a) deposited on the structure of FIG. 3(b).

An alternative to depositing Te and then scanning reductively to reduce off the excess Te, represented in FIGS. 4 and 5, is to perform the Te deposition at −0.85 V. At this potential, as discussed previously, the $TeO_2$ will reduce first to Te and then excess Te will reduce further to $H_2Te$, which can be rinsed out of the TLE cavity leaving only the Te in contact with Cd.

Figure 6A:
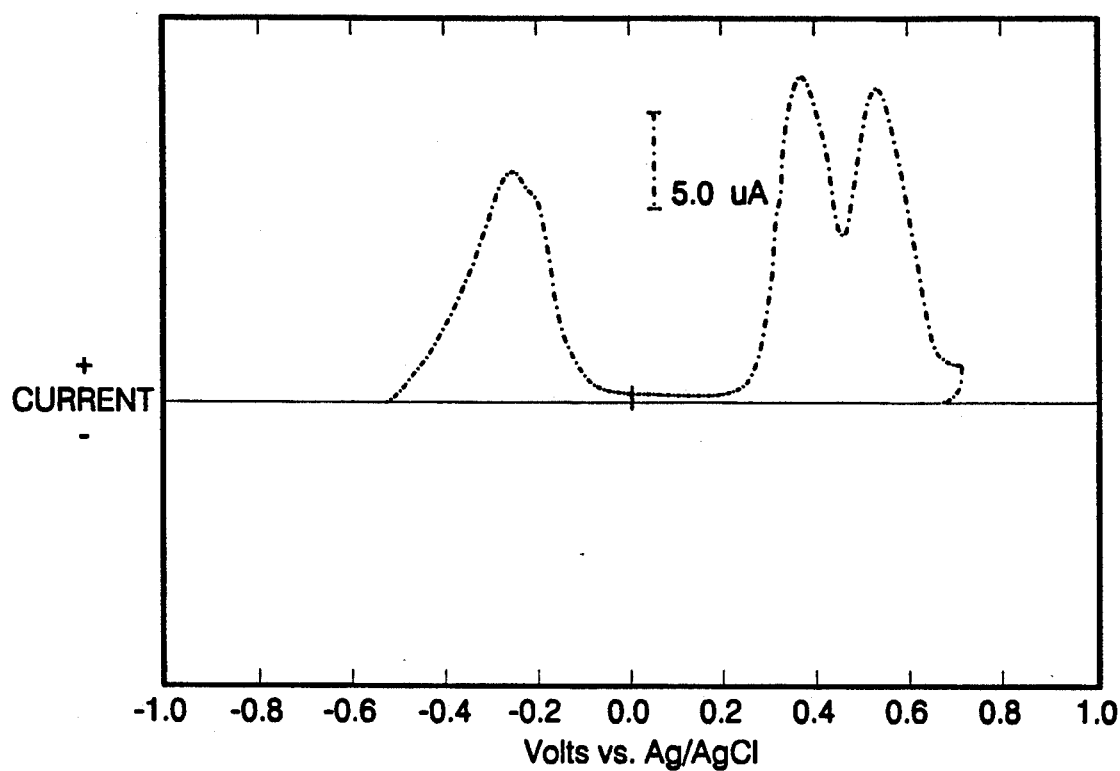
FIG. 6(a) is a current-potential stripping curve following underpotential deposition of Cd onto previously deposited Te using a scan rate of 5 mV/sec.
Figure 6B:
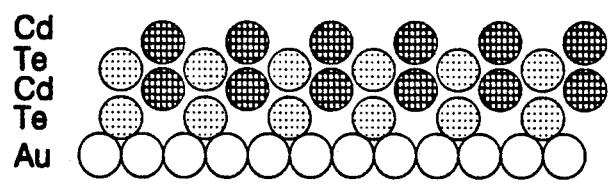
FIG. 6(b) is an illustration of the atomic structure of two ½ ML of Te and two ½ ML of Cd on a Au substrate.

The second layer of Cd must be deposited at a potential sufficiently negative to prevent Cd stripping, yet sufficiently positive to prevent bulk Cd deposition. FIG. 6(a) shows the stripping curve after Cd UPD at −0.60 V. The Cd peak area has doubled while the Te peaks remain unchanged from FIG. 5(a). FIG. 6(b)

shows the two completed layers of CdTe on the Au substrate.

COMPOUND SEMICONDUCTORS

Compound semiconductors can be produced using their natural tendency to form; electrochemically, UPD, is the result of this tendency. This invention allows compound materials to be synthesized electrochemically one atomic layer at a time. This method of deposition avoids the formation of three-dimensional nuclei, and the resulting polycrystalline deposits, by never exceeding the monolayer regime. The potentials are controlled such that only deposition sufficient to cover the deposit occurs and bulk elemental growth is prevented. Each successive element only combines with the previous element deposited, which therefore prevents the buildup of any one element. As a result, CdTe three-dimensional nucleation phenomena encountered with the codeposition of Cd and Te is prevented.

The thin-layer configuration for the electrochemical cell reduces the volumes of solutions exposed to the electrode at a given time, which thus results in significantly less contamination. The adsorption of surface-active contaminants present in the solution can easily result in a monolayer of contamination, which may disrupt epitaxial deposition if a sufficient amount of the contaminant is present. The thin-layer configuration also facilitates the rapid and complete exchange of solutions.

Single-crystalline epitaxial deposits of compound semiconductors can be formed by electrodeposition. The UPD-assisted alternated electrodeposition of the component elements (ECALE) facilitates the formation of these deposits. Deposition in a TLE configuration and use of single-crystal substrates is desirable for high quality deposits. Compounds such as CdTe, CdS, and CdSe, as well as alloys of these materials, are producible by the ECALE method. Other materials such as the III-V semiconductors and II-VI compounds of Zn and Hg are also possible as well as IV-VI, II-V, V-VI, and III-VI compounds.

The above description and example is intended for illustrative purposes of the best mode of the invention contemplated by the inventors only, and those skilled in the art may identify variations or alternations without departing from the spirit of the invention which is defined by the following claims.

What is claimed is:

1. A method for producing epitaxial single-crystalline compound semiconductors by depositing semiconductor material onto a substrate using underpotential deposition, comprising the steps of:
   (a) providing said substrate;
   (b) providing a first reactant in a first solution;
   (c) providing a second reactant in a second solution;
   (d) providing a means for controlling the electrochemical potential of said substrate relative to a reference electrode;
   (e) sequentially electrodepositing an atomic layer of said first reactant and said second reactant on said substrate by sequentially contacting said first solution containing said first reactant with said substrate and said second solution containing said second reactant with said substrate and by sequentially adjusting the electrochemical potential of said substrate relative to said reference electrode, said first reactant being deposited on said substrate at a first electrochemical potential and said second reactant being deposited on said substrate at a second electrochemical potential lower than the potential necessary to deposit a layer of said second reactant onto itself, said reference electrode being in contact with said first solution when said first solution is in contact with said substrate and in contact with said second solution when said second solution is in contact with said substrate; and
   (f) repeating step (e) until and epitaxial single-crystalline compound semiconductor of a desired thickness is obtained.

2. The method as claimed in claim 1, wherein each of said atomic layers of said reactants comprises a half-monolayer of a monolayer of the resulting compound.

3. The method as claimed in claim 1, wherein said first reactant is a metal.

4. The method as claimed in claim 3, wherein said first reactant is selected from the group consisting of Group IB, Group IIB, Group IIIA, Group IVA and Group VIA elements.

5. The method as claimed in claim 1, wherein said second reactant is selected from the group consisting of Group IVA, Group VA and Group VIA elements.

6. The method as claimed in claim 5, wherein said second reactant is selected from the group of elements consisting of Tellurium, Selemium, Sulfur, Arsenic, Antimony, Bismuth, Germanium, Tin and Lead.

7. The method as claimed in claim 1, wherein said second reactant is a metal.

8. The method as claimed in claim 7, wherein said first reactant is selected from the group consisting of Group IB, Group IIB, Group IIIA, Group IVA and Group VIA elements.

9. The method as claimed in claim 1, wherein said first reactant is selected from the group consisting of Group IVA, Group VA and Group VIA elements.

10. The method as claimed in claim 9, wherein said first reactant is selected from the group of elements consisting of Tellurium, Selemium, Sulfur, Arsenic, Antimony, Bismuth, Germanium, Tin and Lead.

11. The method as claimed in claim 1, wherein said substrate is polycrystalline.

12. The method as claimed in claim 1, wherein said substrate is a single crystal.

13. The method as claimed in claim 1, wherein said substrate is selected from the group consisting of Copper, Gold, Silver, Platinum, Compound semiconductors, Germanium, Silicon, Carbon, Nickel, and Titanium.

14. The method as claimed in claim 1, wherein said first reactant is delivered to said substrate in a first solution comprising said first reactant and an electrolyte and said second reactant is delivered to said substrate in a second solution comprising said second reactant and an electrolyte.

15. The method as claimed in claim 14 wherein said reactants are delivered to said substrate as dissolved gases.

16. The method as claimed in claim 1, wherein said substrate is lattice-matched.

17. A method for producing epitaxial single-crystalline compound semiconductors using underpotential electrochemical deposition, comprising the steps of
   (a) providing a substrate;
   (b) providing a first reactant selected from the group consisting of Group IB, Group IIB, Group IIIA, Group IVA, Group VA, Group VIA, and Group VIIA elements;

(c) providing a second reactant selected from the group consisting of Group IVA, Group VA and Group VIA elements;

(d) providing means for controlling the electrochemical potential of said substrate;

(e) delivering said first reactant to said substrate in a first solution, selecting and applying a first electrochemical potential to said substrate relative to a reference electrode, both said substrate and said reference electrode being in contact with said first solution containing said first reactant, and electrodepositing an atomic layer of said first reactant on said substrate;

(f) delivering said second reactant to said substrate in a second solution, selecting and applying a second electrochemical potential to said substrate relative to said reference electrode, both said substrate and said reference electrode being in contact with said second solution containing said second reactant, and electrodepositing an atomic layer of said second reactant on said substrate using underpotential electrochemical deposition wherein said second electrochemical potential is lower than the potential necessary to deposit a layer of said second reactant onto itself; and (g) sequentially repeating steps (e) and (f) until an epitaxial single-crystalline compound semiconductor of a desired thickness is obtained.

18. The method as claimed in claim 17, further comprising the steps of:

(e1) rinsing any of said first reactant greater than a single atomic layer remaining on said substrate from said substrate; after step (e) and prior to step (f), and the step of:

(f1) rinsing any of said second reactant greater than a single atomic layer remaining on said substrate from said substrate; after step (f) and prior to step (g).

19. The method as claimed in claim 18, wherein steps (e), (e1), (f), and (f1) are repeated sequentially until an epitaxial single-crystalline compound semiconductor of a desired thickness is obtained.

20. The method as claimed in claim 18, wherein said rinsing steps (e1) and (f1) are accomplished using an electrolytic solution.

* * * * *